(12) United States Patent
Beier et al.

(10) Patent No.: US 9,325,344 B2
(45) Date of Patent: Apr. 26, 2016

(54) ENCODING DATA STORED IN A COLUMN-ORIENTED MANNER

(75) Inventors: Felix Beier, Benshausen (DE); Oliver Draese, Holzgerlingen (DE); Knut Stolze, Jena (DE)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 450 days.

(21) Appl. No.: 13/206,827

(22) Filed: Aug. 10, 2011

(65) Prior Publication Data

US 2012/0143913 A1    Jun. 7, 2012

(30) Foreign Application Priority Data

Dec. 3, 2010  (EP) ..................... 10193677

(51) Int. Cl.
G06F 17/30 (2006.01)
H03M 7/40 (2006.01)
H03M 7/46 (2006.01)

(52) U.S. Cl.
CPC ........... *H03M 7/40* (2013.01); *G06F 17/30303* (2013.01); *H03M 7/46* (2013.01)

(58) Field of Classification Search
CPC ............................... G06F 17/30303
USPC ............................... 707/706
See application file for complete search history.

(56) References Cited

U.S. PATENT DOCUMENTS

| 7,024,414 | B2 | 4/2006 | Sah et al. | |
|---|---|---|---|---|
| 7,496,589 | B1 | 2/2009 | Jain et al. | |
| 7,539,685 | B2 | 5/2009 | Mosescu | |
| 7,730,106 | B2 | 6/2010 | Browning | |
| 2003/0028509 | A1* | 2/2003 | Sah et al. | 707/1 |
| 2003/0220771 | A1* | 11/2003 | Vaidyanathan et al. | 703/2 |
| 2008/0222136 | A1* | 9/2008 | Yates et al. | 707/5 |
| 2008/0294863 | A1 | 11/2008 | Faerber et al. | |
| 2009/0106210 | A1 | 4/2009 | Slezak et al. | |
| 2010/0281079 | A1* | 11/2010 | Marwah et al. | 707/812 |

FOREIGN PATENT DOCUMENTS

EP    1283486 A2    2/2003

OTHER PUBLICATIONS

Baid et al., "Binary Encoded Attribute-Pairing Technique for Database Compression", Computer Sciences Department, University of Wisconsin, Madison, (8 pages).

(Continued)

*Primary Examiner* — James Trujillo
*Assistant Examiner* — Kurt Mueller
(74) *Attorney, Agent, or Firm* — Mohammed Kashef; Edell, Shapiro & Finnan, LLC

(57) ABSTRACT

Data stored in a column-oriented manner is encoded using a data mining algorithm for finding column patterns among a set of data tuples, where each data tuple contains a set of columns, and the data mining algorithm treats all columns and all column combinations and column ordering similarly or in the same manner when looking for column patterns. Column values are ordered occurring in the column patterns based on their frequencies into a prefix tree, where the prefix tree defines a pattern order. The data tuples are sorted according to the pattern order, resulting in sorted data tuples, and columns of the sorted data tuples are encoded using run-length encoding.

24 Claims, 11 Drawing Sheets

(56) References Cited

OTHER PUBLICATIONS

Xin et al., "C-Cubing: Efficient Computation of Closed Cubes by Aggregation-Based Checking", University of Illinois at Urbana-Champaign, Urbana, IL, (10 pages).

Zaki et al., "CHARM, An Efficient Algorithm for Closed Itemset Mining", Computer Science Department, Rensselaer Polytechnic Institute, Troy, NY, (17 pages).

Wang, et al., "CLOSET+: Searching for the Best Strategies for Mining Frequent Closed Itemsets", SIGKDD '03 Aug. 24-27, 2003, Washington, D.C., (10 pages).

Azinta Systems: Open Source Data Warehouse, Open Source BI, Open Source ETL, Vuln . . . , Column-based Open Source Data Warehouse Overview, Jul. 21, 2010, (3 pages).

Boncz, "Column-Oriented Database Systems", Adapted from VLDB 2009 Tutorial Column-Oriented Database Systems with Daniel Abadi (Yale) Stavros Harizopuolos (HP Labs), (pp. 1-149).

Stonebraker et al., "C-Store: A Column-oriented DBMS", Proceedings of the 31st VLDB Conference, Trondheim, Norway, 2005, (12 pages).

Enterprise Platform and Integration Concepts—DataStructures, Data Structures and Compression Techniques, Jul. 21, 2010, (3 pages).

Grahne et al., "Efficiently Using Prefix-trees in Mining Frequent Itemsets", Concordia University Montreal, Canada, (10 pages).

Grahne et al., "Fast Algorithms for Frequent Itemset Mining Using FP-Trees", IEEE Transactions on Knowledge and Data Engineering, vol. 17, No. 10, Oct. 2005, (pp. 1347-1362).

Han et al., "Frequent Pattern Mining: Current Status and Future Directions", Data Min Knowl Disc (2007) 15:55-86 DOI 10.1007/s10618-006-0059-1, Published online: Jan. 27, 2007, Springer Science+Business Media, LLC 2007, (32 pages).

Abadi et al., "Integrating Compression and Execution in Column Oriented Database Systems", SIGMOD 2006, Jun. 27-29, 2006, Chicago, Illinois, USA. Copyright 2006 ACM 1595932569/06/0006, (12 pages).

Giannella et al., "Mining Frequent Patterns in Data Streams at Multiple Time Granularities", Chapter 3, (pp. 191-212).

Han et al., "Mining Frequent Patterns without Candidate Generation: A Frequent-Pattern Tree Approach", Data Mining and Knowledge Discovery, 8, 53-87, 2004 c 2004 Kluwer Academic Publishers. Manufactured in The Netherlands, (35 pages).

Ailamaki, "Weaving Relations for Cache Performance", Proceedings of the 27th VLDB Conference, Roma, Italy, 2001, (12 pages).

Li et al., "Mining Multi-dimensional Frequent Patterns Without Data Cube Construction", The Data Base and Knowledge Engineering Lab (DBKE) Computer School of Sichuan University Chengdu University of Traditional Chinese Medicine, Q. Yang and G. Webb (Eds.): PRICAI 2006, LNAI 4099, © Springer-Verlag, Berlin Heidelberg 2006, (pp. 251-260).

PCT International Search Report and Written Opinion, PCT/EP2011/069324, Feb. 7, 2012, 14 pages.

Daniel J. Abadi, Query Execution in Column-Oriented Database Systems, Massachusetts Institute of Technology 2008, pp. 1-94 and 131-148.

\* cited by examiner

ENCODING DATA STORED IN A COLUMN-ORIENTED MANNER

BACKGROUND

The present invention relates in general to the field of memory database systems, and in particular to a method for encoding data stored in a column-oriented manner, and a data processing system for encoding data stored in a column-oriented manner. Still more particularly, the present invention relates to a computer program product for performing a method for encoding data stored in a column-oriented manner.

In main memory database systems, the available memory for storing table data may be limited. Therefore, the data must be compressed to be able to store it completely. Furthermore, there must exist a way of accessing the original values for query processing. In modern in-memory databases for operational warehousing a column-oriented store, scanning the entire table data of all required columns plays a role. Due to that, the amount of frequently accessed values is too large for caching all of them in a decompressed manner.

Since scanning a table is a CPU intensive operation, massive parallel processing is used to alleviate this bottleneck. Therefore, the warehouse data can be distributed on several nodes which perform the scan separately on a subset of the table data first, and secondly merge their results. In a snow flake schema, which is typical for online analytical processing (OLAP) warehouses, most of the data is stored in a central fact table which is connected to multiple small dimension tables. The central fact table then stores the measure values in a multidimensional online analytical processing (OLAP) cube. The dimension values are just represented by small IDs and stored in separate tables which need to be joined with the fact table if required by a query.

SUMMARY

Present invention embodiments provide a method and a data processing system for encoding data stored in a column-oriented manner.

In an embodiment of the present invention a method for encoding data stored in a column-oriented manner comprises using a data mining algorithm for finding frequent column patterns among a set of data tuples, wherein each data tuple is containing a set of columns, and the data mining algorithm treats all columns and all column combinations and column ordering similarly when looking for column patterns; ordering column values occurring in the frequent column patterns based on their frequencies into a prefix tree, wherein the prefix tree defines a pattern order; sorting the data tuples according to the pattern order, resulting in sorted data tuples; and encoding columns of the sorted data tuples using run-length encoding.

Further embodiments of the present invention comprise dividing the sorted data tuples in smaller, already precompressed parts; and recursively using the smaller already precompressed parts as input for the data mining algorithm for finding frequent column patterns among the sorted data tuples.

Further embodiments of the present invention comprise using only values of different columns in each tuple.

Further embodiments of the present invention comprise using a limited number of columns of a single table as the column set.

Further embodiments of the present invention comprise interpreting the single table as a transactional database with the tuples as transactions and pairs of column ID and column value as items.

Further embodiments of the present invention comprise using a fixed buffer of main memory for the data mining algorithm; and generating a output list containing at least one of all frequent column value combinations and all closed frequent column value combinations under a minimum support threshold, which is dynamically adaptable to reduce a size of the output list, and bounding a maximum length of each frequent column value combination by the number of columns used in each data tuple.

Further embodiments of the present invention comprise using only columns of the single table having certain characteristics promising a high compression ratio for building the tuples.

Further embodiments of the present invention comprise estimating cardinality for columns of the single table using an incremental cardinality algorithm; and using the cardinality as the characteristic promising a high compression ratio.

Further embodiments of the present invention comprise assigning a pair of column ID and column value to each node of the prefix tree, each node having an ID field which is unique within the prefix tree and two counter fields; and linking the nodes together by at least one of frequent pattern links, column links or rank links.

Further embodiments of the present invention comprise modifying paths of the prefix tree of the frequent column patterns by weighting or swapping nodes of the prefix tree to optimize the prefix tree.

Further embodiments of the present invention comprise grouping multiple columns together to be interpreted as a single item during the data mining phase.

In another embodiment of the present invention, a data processing system for encoding data stored in a column-oriented manner comprises a processor for performing the operations of finding frequent column patterns among a set of data tuples, wherein each data tuple is containing a set of columns, and treating all columns and all column combinations and column ordering similarly when looking for column patterns; ordering column values occurring in the frequent column patterns based on their frequencies into a prefix tree, wherein the prefix tree is defining a pattern order; sorting the data tuples according to the pattern order, resulting in sorted data tuples; and encoding columns of the sorted data tuples using run-length encoding.

In further embodiments of the present invention, the sorted data tuples are divided in smaller, already precompressed parts, and a recursive run is performed for finding frequent column patterns among the sorted data tuples.

In yet another embodiment of the present invention, a computer readable storage medium having a computer readable program code embodied therewith, the computer readable program code configured to perform operations of finding frequent column patterns among a set of data tuples, wherein each data tuple contains a set of columns, and treating all columns and all column combinations and column ordering similarly when looking for column patterns; ordering column values occurring in the frequent column patterns based on their frequencies into a prefix tree, wherein the prefix tree defines a pattern order; sorting the data tuples according to the pattern order, resulting in sorted data tuples; and encoding columns of the sorted data tuples using run-length encoding.

Embodiments of the present invention optimize the layout of data structures storing table data with intent to remove redundancy within columns or groups of columns. Embodiments maximize the compression rate of both, single table data and data of denormalized tables with the help of data mining techniques and run length encoding.

DETAILED DESCRIPTION

Data mining techniques are used to gather a multidimensional histogram of frequent column values which can be applied to optimize the data structures storing tuples in the database system. The tuples will be compressed with run length encoding which also increases the amount of tuples that can be processed with a single predicate evaluation during a table scan.

Embodiments of the present invention exploit knowledge of frequent patterns among all columns in a table which should be optimized. Therefore, in a first phase, column value correlations are detected with a data mining algorithm without preferring any column. The data mining algorithm is arbitrary but works with a fixed buffer of main memory.

A single table is interpreted as a transactional database with tuples as transactions and pairs of column identification (ID), and column value as items. The output of the first phase is a (closed) set of frequent column value combinations. Since tuples are interpreted as transactions, only values of different columns can be found as frequent itemsets. Therefore, their lengths are bounded by the number of columns of the considered table which can be reduced by projecting only onto some columns of the entire table with low cardinality which promise high compression ratio.

The second phase arranges these sets with frequent column values in a frequent pattern tree like data structure adapted for efficient access. Further optimization steps can be applied to increase the compression due to the usage of common prefixes among the frequent patterns. The final step of the second phase enumerates all patterns with unique identifications which define a strict order between two patterns.

This ordering function is used in the third phase for sorting the tuples of the considered table part and applying first compression steps. Due to the fact that the algorithm runs with memory restrictions, the number of frequent column sets which can be considered is limited to a fixed size because for efficient access, the resulting data structure from phase two must fit entirely in main memory. But the algorithm is designed to be used recursively. Thus, the output of the third phase can be divided in smaller, already precompressed parts and used as input for phase one again if needed. After a recursive call finishes, the blocks are locally compressed with unused memory gaps in between. To avoid the latter and to removing possible auxiliary data, a finalization step is required which can be done after each recursive call to keep the algorithm's memory overhead low, or after the initial call returns. Latter has a better runtime but requires more memory.

Figure 2:
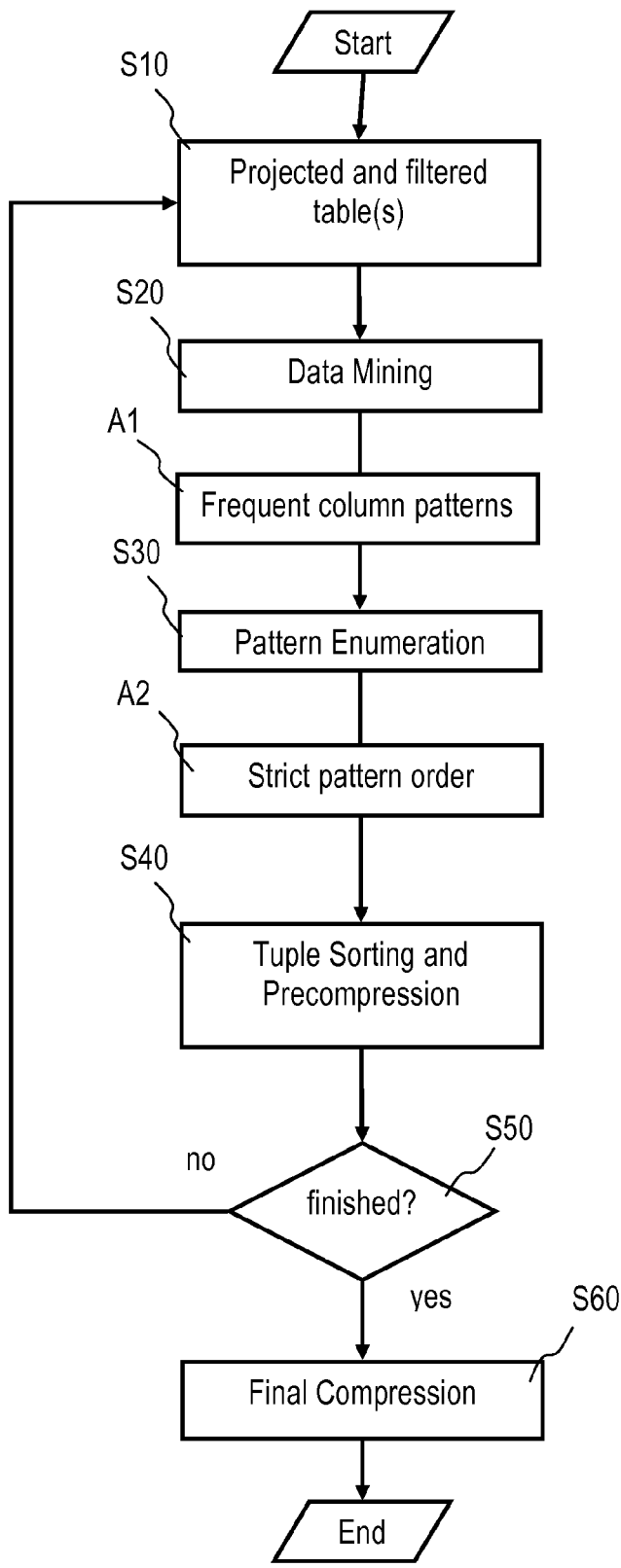
FIG. 2 is a schematic flow diagram of a method for encoding data stored in a column-oriented manner, in accordance with an embodiment of the present invention.
Figure 3:
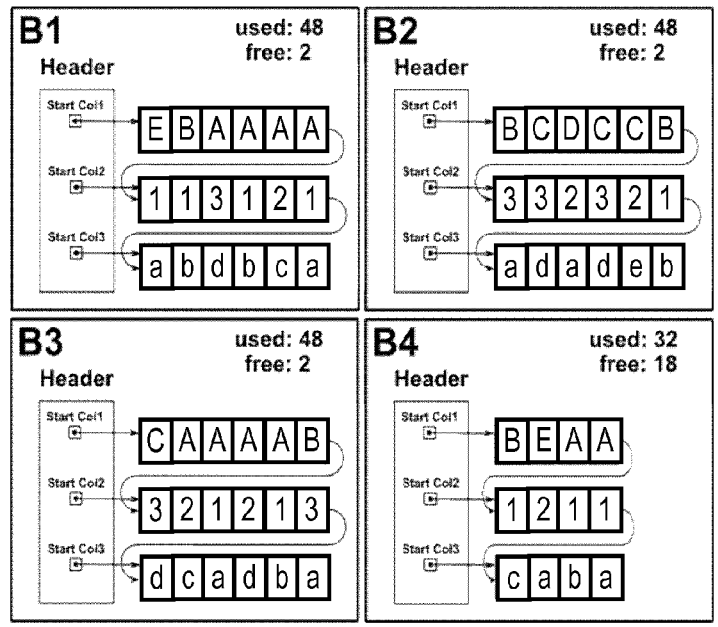
FIG. 3 is a schematic block diagram of memory blocks having an initial state.

The above as well as additional features of the present invention will become apparent in the following description with reference to FIGS. 1-3.

Figure 1:
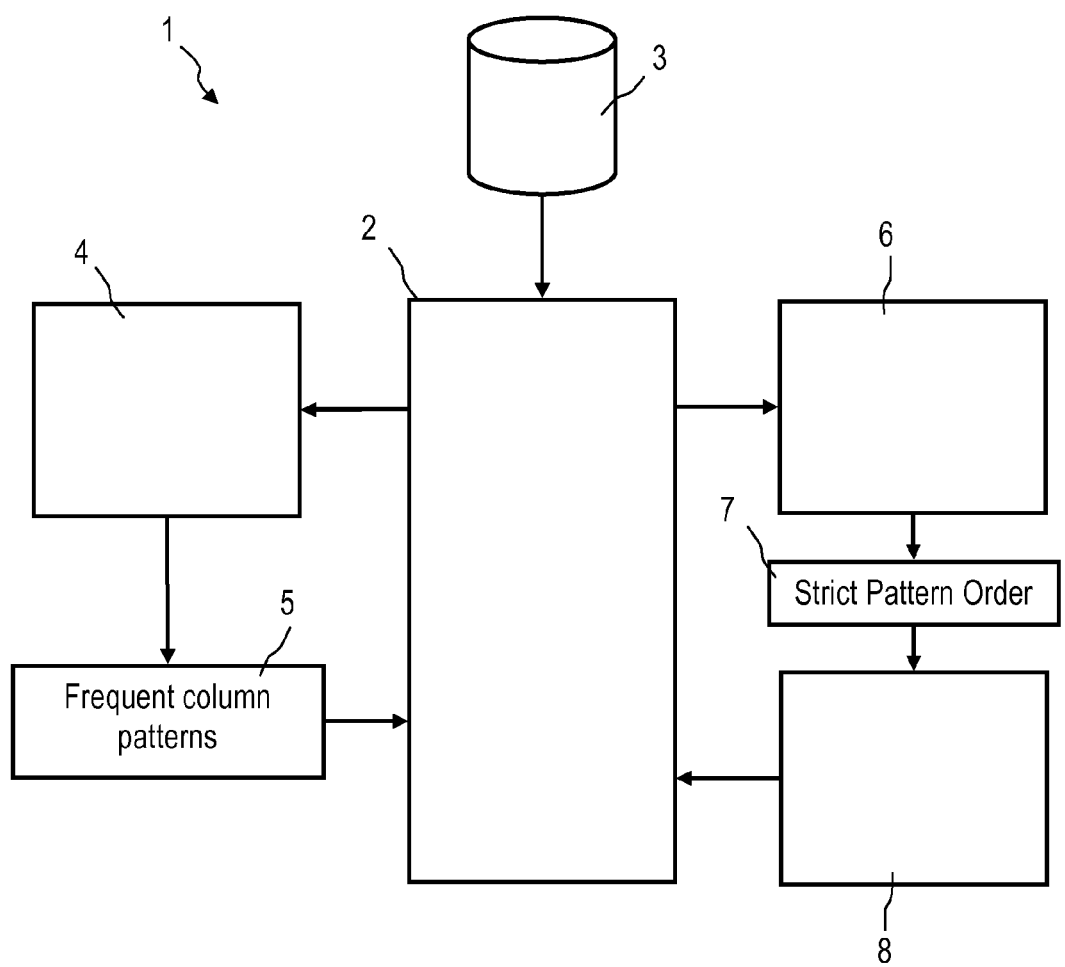
FIG. 1 is a schematic block diagram of a data processing system, in accordance with an embodiment of the present invention.

FIG. 1 is a schematic block diagram of a data processing system 1, in accordance with an embodiment of the present invention.

Referring to FIG. 1, the shown embodiment of the present invention employs a data processing system 1 for encoding data stored in a column-oriented manner, comprising a data processing unit 2, a storage device 3 for projected and filtered table(s), a data mining algorithm 4, a pattern enumeration algorithm 6, and sorting and encoding means 8. According to embodiments of the present invention the data mining algorithm 4 is used for finding frequent column patterns 5 among a set of data tuples, wherein each data tuple contains a set of columns, and the data mining algorithm 4 treats all columns and all column combinations and column ordering similarly (e.g., in the same manner) when looking for column patterns. The pattern enumeration algorithm 6 orders column values occurring in the frequent column patterns 5 based on their frequencies into a prefix tree 20, 22, 24, shown in FIG. 5, 6, 11. The prefix tree 20, 22, 24 defines a pattern order 7; and the sorting and encoding means 8 sort the data tuples according to the pattern order 7, resulting in sorted data tuples. The sorting and encoding means 8 also encode columns of the sorted data tuples using run-length encoding.

The sorting means 8 divide the sorted data tuples in smaller, already precompressed parts, and return them as input to the data mining algorithm 4, which performs a recursive run for finding frequent column patterns 5 among the sorted data tuples.

Referring to FIGS. 2 to 13, for the algorithms described in the following, it is assumed that tuples of a table are stored block wise in a column oriented manner, as in a PAX data structure. These blocks B1, B2, B3, B4 are distributed in a cluster consisting of one or more nodes which have a limited amount of buffer memory available for processing. Column values are stored continuously in memory and can be scanned separately. The references to the start of each column within the block like memory addresses or offsets are stored in each block header.

Example definitions of a frequent itemset and a closed frequent itemset are as follows. A set of items I is defined as $I=\{i_1, i_2, \ldots i_n\}$. A transaction $t=(tid, X)$ is a 2-tuple consisting of a unique identification tid and an itemset X. A transactional database TDB={$t_1, t_2, \ldots t_m$} is a set of transactions, and min_sup is a positive integer. An itemset I is frequent in the transactional database TDB if the number of transactions containing it (support of I) is greater than min_sup ($|\{t=(tid, X)|t \in TDB \hat{} I \subseteq X\}| \geq min\_sup$).

A frequent itemset I is called closed if there exists no second itemset J with $I \subset J$ and a support greater or equal to the support of I. An appriori principle defines that an itemset I is frequent if all sub-itemsets J with $J \subset I$ are frequent.

Embodiments of the present invention exploit knowledge of frequent patterns among all columns in a table which should be optimized. Therefore, they detect column value correlations with a data mining algorithm 4 as first step without preferring any column. The used mining algorithm 4 is arbitrary but must work with a fixed buffer of main memory. FIG. 2 shows the main phases of the proposed method for encoding data stored in a column-oriented manner.

In step S10 a single table is interpreted as a transactional database with tuples as transactions and pairs of column identification and column values as items. The output of the data mining algorithm 4 run in step S20 as first phase is a (closed) set of frequent column value combinations A1. Since tuples are interpreted as transactions, only values of different columns can be found as frequent itemsets. Therefore, their lengths are bounded by the number of columns of the considered table which can be reduced by projecting only onto some columns of the entire table with low cardinality which promise high compression ratio.

In step S30 these sets with frequent column values are arranged in a frequent pattern tree like data structure adapted for efficient access. Further optimization steps can be applied to increase the compression benefit due to the usage of common prefixes among the frequent patterns. The final step of the second phase enumerates all patterns with unique identifications which define a strict order A2 between two patterns.

This ordering function is used in the third phase for sorting the tuples of the considered table part and applying first compression steps in step S40. Due to the fact that the algorithm runs with memory restrictions, the number of frequent column sets which can be considered is limited to a fixed size because, for efficient access, the resulting data structure A2 from step S30 must fit in main memory entirely. But the algorithm is designed to be used recursively. Thus, the output of step S40 in the third phase can be divided in smaller, already precompressed parts and used as input for step S10 in the first phase again if needed and the query in step S50 is answered with yes. After a recursive call finishes, the blocks are locally compressed with unused memory gaps in between. To avoid the latter and to remove possible auxiliary data, a final compression step S60 is performed if the query in step S50 is answered with no. The final compression step S60 can be done after each recursive call to keep the algorithm's memory overhead low, or after the initial call returns. The latter has a better runtime but requires more memory. In the shown embodiment the final compression step S60 is done after the initial call returns.

For illustrating the method for encoding data stored in a column-oriented manner, it is applied on an example table shown in Table 1. Table 1 consists of three columns Col1, Col2, Col3 with low cardinality and 22 randomly generated tuples. For simplification, it is assumed that all columns Col1, Col2, Col3 are fixed sized and need the number of bytes noted in parenthesis after their names. But embodiments of the present invention can also be applied on variable length data columns.

The table data is stored column wise in blocks B1, B2, B3, B4 with a fixed size of 50 Byte in the example. Of course, variable block sizes are possible too. To avoid ambiguities between columns without the column identification and column value pair notation, the columns have different domains assigned (capital letters for column 1, numbers for column 2, and small letters for column 3). The initial storage layout is shown in FIG. 3.

TABLE 1

| Col 1 (4) | Col 2 (2) | Col 3 (2) |
|---|---|---|
| E | 1 | a |
| B | 1 | b |
| A | 3 | d |
| A | 1 | b |
| A | 2 | c |
| A | 1 | a |
| B | 3 | a |
| C | 3 | d |
| D | 2 | a |
| C | 3 | d |
| C | 2 | e |
| B | 1 | b |
| C | 3 | d |
| A | 2 | c |
| A | 1 | a |
| A | 2 | d |
| A | 1 | b |
| B | 3 | a |
| B | 1 | c |
| E | 2 | a |
| A | 1 | b |
| A | 1 | a |

In the first phase, the input data set is scanned multiple times and column value correlations are detected with the frequent pattern mining algorithm 4. Since a lot of surveys have been conducted on this topic, details of the algorithms 4 are omitted here. The used algorithm 4 is arbitrary and should be chosen depending on the data distribution, e.g. a frequent pattern tree based algorithm for dense data sets. Example data mining algorithms are Frequent-Pattern-GROWTH, Frequent-Pattern-CLOSE, CHARM, CLOSET+, etc. Since these algorithms are designed for transactional databases, the input table data has to be transformed into a transactional form. Because columns could have the same domain, only pairs of column identification and column value can be regarded as unique items in a tuple interpreted as itemset. All input tuples together represent a transactional database.

It is assumed that the used data mining algorithm 4 works with a fixed buffer of main memory and generates a list containing all frequent column value combinations under a minimum support threshold. The latter might be adapted dynamically to reduce the size of the output list. If the threshold is increased, some (especially longer) patterns will not be regarded as frequent and can therefore not be considered for compression in the current iteration. But according to the a priori principle, the mining algorithm can be applied recursively with lower thresholds on already processed parts of the input data.

Table 2 shows the frequent patterns and the closed frequent patterns that can be mined in the running example with a minimum support threshold of 3. For the further steps, the closed itemsets are used since they represent the data in a more compact way because some frequent patterns are redundant, e.g. Aa:3, Ab:3 are included in the longer patterns A1a:3 and A1b:3. This pattern list is provided as input for the second phase.

TABLE 2

| pattern length | frequent patterns | closed frequent patterns |
|---|---|---|
| 1 | A:10, B:5, C:4, 1:10, 2:6, 3:6, a:8, b:5, c:3, d:5 | A:10, B:5, C:4, 1:10, 2:6, 3:6, a:8, c:3, d:5 |
| 2 | A1:4, A2:3, 1a:5, 1b:5, 3d:4, B1:3, C3:3, Aa:3, Ab:3, Cd:3 | A1:4, A2:3, 1a:5, 1b:5, 3d:4, B1:3 |
| 3 | A1a:3, A1b:3 C3d:3 | A1a:3, A1b:3 C3d:3 |

The patterns generated in phase one will be used to sort the input tuples for being able to apply run length encoding afterwards. Therefore, a new data structure, a tuple rank and compression lattice (TRCL) which consists of several nodes 10 was developed in which each pattern comprises a unique number and which offers an effective way to compare two tuples. One example node 10 of the tuple rank and compression lattice (TRCL) is shown in FIG. 4.

Figure 4:
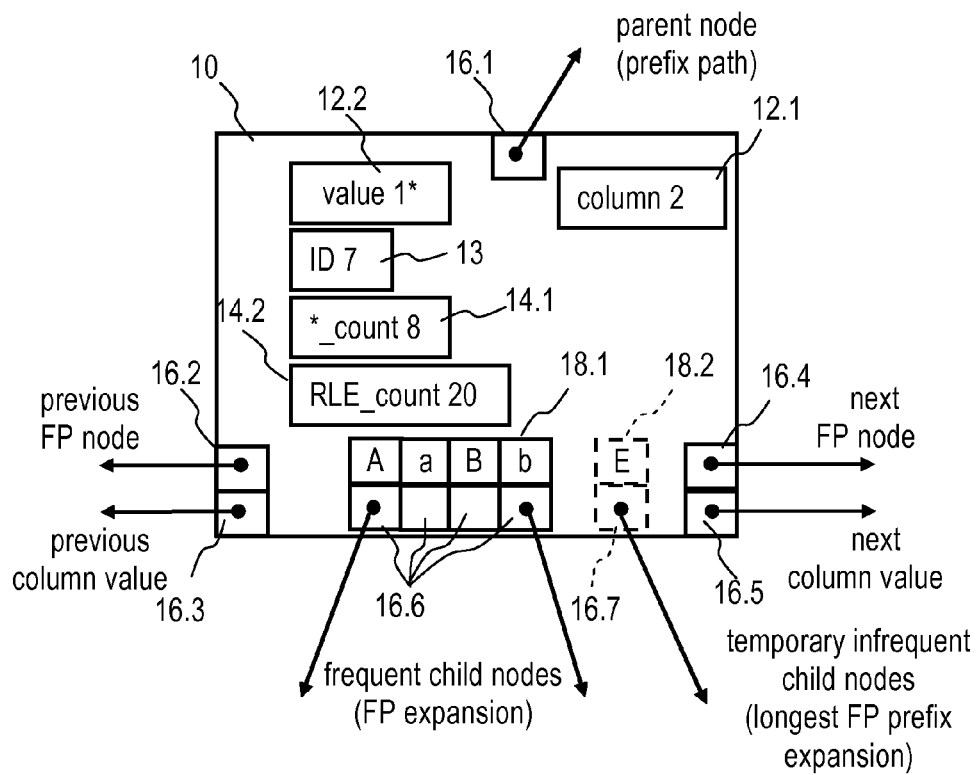
FIG. 4 is a schematic block diagram of an exemplary tuple rank and compression lattice node, in accordance with an embodiment of the present invention.

Referring to FIG. 4, each node 10 has a column identification 12.1 and column value 12.2 pair assigned, and an identification (ID) field 13 which is unique within the entire lattice. Each node 10 also comprises two counter fields 14.1 and 14.2 which will be required and explained in more detail in the third phase of the method for encoding data stored in a column-oriented manner. The nodes 10 are linked together in three different ways. Frequent pattern links 16.6 can be used to reconstruct the frequent column value patterns within the lattice. They form a frequent pattern tree which can be traversed in both directions. Common prefixes are shared among patterns with a parent node link 16.1. The child nodes 16.6 and 16.7 can be accessed through two hash tables 18.1 and 18.2 which map column identification 12.1 and column value 12.2 pairs to node links 16.6 and 16.7 and can be regarded as extension of the pattern consisting of all column values in the nodes 10 which lie on the path from the current node to the root. The hash table entries are sorted by a column value order which is determined on construction of the lattice. The first hash table 18.1 is static too, i.e. its entries are inserted on construction and won't be modified until the method finishes. It represents the links 16.6 to frequent column value nodes which were constructed in phase one. The second hash table 18.2 is only filled dynamically in the sorting and compression phase and contains links 16.7 to column value nodes which are not frequent according to the support threshold used in the data mining phase.

All nodes 16.3, 16.5 of one column Col1, Col2, Col3 are linked together in the sorting and compression phase for an easy transformation of the lattice in blocks. The nodes 10 are managed in a doubly linked list whose head is stored in the lattice's header table.

For runtime speedup, a small additional auxiliary column rank with constant size can be introduced for each tuple which decreases the time needed for sorting tuples. This auxiliary column rank will be removed during the final compression phase and requires two additional links 16.2 and 16.4 per frequent pattern node 10 because they will, like the column links 16.3 and 16.5, be chained together in a doubly linked list.

The lattice is constructed in a way similar to the way in which a frequent pattern tree is constructed. The frequent column value patterns provided as input will be interpreted as transactions again. First, they will be scanned once to determine the frequency of each single column value. Second, they will be sorted by decreasing frequency of step one and inserted in the embedded prefix tree of the TRCL.

Table 3 shows the sorted frequencies of single column values in the closed frequent patterns of the running example.

TABLE 3

| column id | column value | frequency in closed frequent patterns |
|---|---|---|
| 2 | 1 | 7 |
| 1 | A | 5 |
| 2 | 3 | 3 |
| 3 | a | 3 |
| 3 | d | 3 |
| 1 | B | 2 |
| 1 | C | 2 |
| 2 | 2 | 2 |
| 3 | b | 2 |
| 3 | c | 1 |

A value which is frequent here means that a lot of column value combinations share this single value. This fact is exploited to reduce the number of nodes 10 in the prefix tree by sharing frequent ones. If closed frequent patterns are mined in the first step, the counts will not be affected by redundant short patterns which are subsets of longer ones with the same or higher support. Therefore, the tree will be more compact and result in better compression rates later on.

Figure 5:
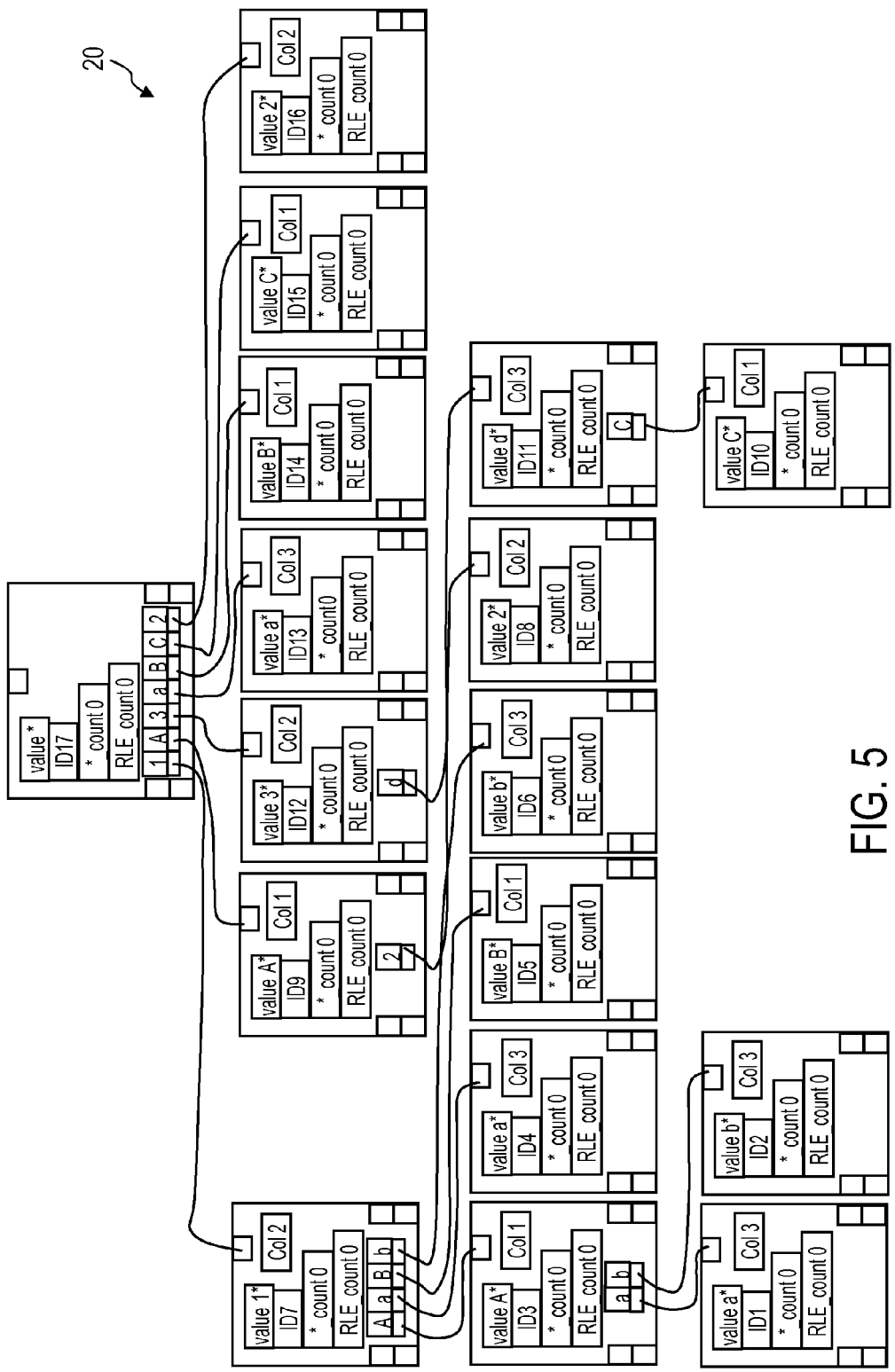
FIG. 5 is a schematic block diagram of an exemplary prefix tree after all closed frequent column value patterns of the running example have been inserted.

On insertion of a pattern, the first column value with the highest frequency is inserted in the root of the prefix tree if necessary, i.e. a new node and an entry in the first hash table 18.1 is created for it if it has not been done before. The new node is linked with the parent node. All other links are marked as not available and the counters 14.1 and 14.2 are initialized to zero. The second hash table 18.2 will be empty. This procedure is continued recursively with the remaining pattern with lower frequencies and the last node regarded as tree root as long as there are single column values left in the pattern. FIG. 5 shows the result prefix tree 20 after all closed frequent column value patterns of the running example have been inserted.

The prefix tree 20 is a compressed representation of all frequent patterns provided as input for phase two. Since it is guaranteed by the mining algorithms 4 that the pattern list fits into main memory for a fixed buffer size, the entire tree 20 will fit into main memory too because it contains at maximum as many nodes 10 as there are single column values in the entire set in the case where all patterns are disjoint. The memory overhead for one node 10 is constant and therefore the buffer size can be chosen appropriately. Memory is needed for the column identification (ID) 12.1 and the column value 12.2 itself, the counters 14.1, 14.2, one hash table entry in the parent node, one link 16.1 to the parent node, constant overhead for the two hash tables 18.1, 18.2, and four outgoing links 16.2, 16.3, 16.4, 16.5 to neighbor nodes.

The number of nodes 10 is limited and the maximum length of a path from root to leaf nodes is c for c=number of columns provided as input for the data mining phase. If input tuples have c columns, all tuples in the table can be interpreted as a complete path in the tree of length c. Let T be a frequent pattern subtree whose root is located in level L in a branch of the global tree. Due to the construction algorithm of the tree, all child nodes are ordered descending by frequency. If child node A has a lower frequency than child node B, the subtree with B as root can be regarded as the right neighbor of the one with A as root. If column value V is contained as a direct child node of T in level L+1, it is not contained in right neighbor trees.

As the last step of phase two, all nodes in the global prefix tree 20, and therefore the patterns are enumerated. This must be done in a way that all child nodes C of a root node R have either a greater or lower identification (ID) 13 than R, or left neighbor trees of R. The IDs 13 in FIG. 5 were assigned using the postorder traversal. This leads to a strict linear ordering of all patterns where longer and more frequent patterns have a lower ID 13 than shorter and infrequent patterns. It is also possible to use other enumeration strategies.

After the tuple rank and compression lattice (TRCL) has been constructed and all frequent column value combinations have been enumerated in phase two, the input tuples can be sorted according to the strict pattern order. Therefore, the input blocks B1, B2, B3, B4 are scanned and each tuple is inserted into the lattice starting at the root node. All column values are looked up in the first hash table 18.1. If any value was found, the path to the child node with the highest/lowest ID is chosen, depending on the enumeration strategy used in phase two. The path with the lowest ID 13 is chosen if the nodes have been postorder enumerated. After this, the remaining columns are inserted recursively in the chosen subtree.

Figure 6:
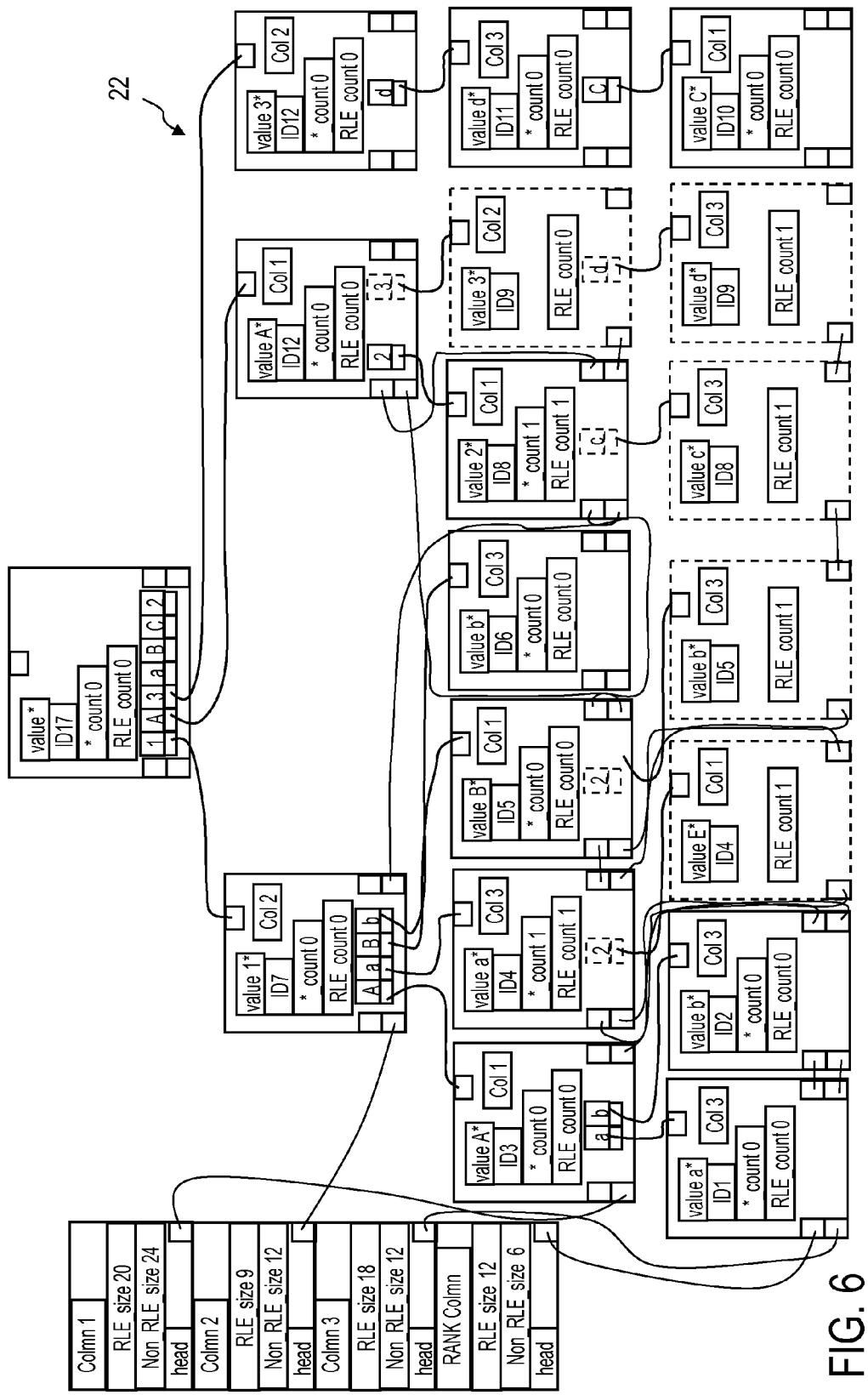
FIG. 6 is a schematic block diagram of an exemplary tuple rank and compression lattice after all tuples of the first memory block of the running example have been inserted.

If no frequent column value was found in the first hash table 18.1, the second (temporary) hash table 18.2 is used. It stores infrequent values of exactly one column and its entries lead to temporary nodes which are created on demand. The order of the columns in the infrequent tree part is predetermined, e.g. by the column ID 12.1 or column cardinality if available. All nodes 10 created in these infrequent cube trees have the same ID 13 as the last frequent node on the path from the root to the node itself and do not need a first counter 14.1 or frequent-pattern-neighbor links 16.6. FIG. 6 shows the resulting tuple rank and compression lattice (TRCL) 22 after all tuples of the first block B1 have been inserted into it. Nodes drawn with dashed lines are temporary ones and appear in ascending order of their column IDs 12.1 on the path from the root to leaf nodes.

When a tuple is inserted, all counter values RLE_count of the second counters 14.2 in the nodes 10 on the insertion path are incremented by one. The counter value *_count of the first counter 14.1 is only incremented in the last frequent pattern node 10 on this path. This means that only longest frequent prefixes are counted. In the example, tuple (A, 2, c) increases the counter value *_count of the node with ID (8) because it was flagged as frequent in the enumeration phase. Tuple (A, 3, d) increases the counter value *_count of node with ID (9) because it was the last frequent node on the path. If the entire tuple consists of infrequent column values, the counter value *_count in the root will be incremented. Additionally, links between the nodes on the current insertion path and previous ones must be established. For each column Col1, Col2, Col3, there exists an entry in the header table of the tuple rank and compression lattice (TRCL) with a link to the first node in the lattice. This is the start of a doubly linked list which chains all nodes of the column Col1, Col2, Col3 ordered by the assigned node ID 13. If the node ID 13 is equal, which would be the case for infrequent column values, the secondary ordering criterion is the column value 12.2—the position of the value entry in the second hash table 18.2 of the parent node. These links allow an easy transformation of the lattice back into blocks. For this, the column lists are traversed one after the other and the column values are written continuously into the block which leads to a column store layout.

Since the method works under memory constraints, it will probably not be possible to insert all tuples of the entire table because new nodes have to be created. Therefore, tuples are inserted into the tuple rank and compression lattice (TRCL) until a block B1, B2, B3, B4 would be filled. To track the memory which would be required to transform the tuple rank and compression lattice into a block, each column header table entry stores two size counters RLE_size, Non_RLE_size. A size counter Non_RLE_size accumulates the memory that would be needed to encode each value individually that has been inserted into the tuple rank and compression lattice. In this case no compression would be achieved. A node that would require n bytes to store the contained value would therefore contribute n*RLE_count bytes to the whole column. But if the node has a high counter value RLE_count, it might be beneficial to use run length encoding (RLE) for the represented column value. Run-length encoding (RLE) would only be used if the additional memory required for storing the counter value is less than the required memory for storing the column values separately. So, when a tuple is inserted, the values of counters Non_RLE_size of all columns Col1, Col2, Col3 are incremented by the size of the respective nodes on the insertion path. The values of counters RLE_size are only updated for those nodes on the path that are visited the first time. In the running example, we assume that for each block B1, B2, B3, B4 each column is either completely run length encoded or not. But it would be possible to prefix only single column values with the counter value.

It is assumed that the additional counter column which would be required has a size of 1 Byte. Therefore, if it's decided to compress a column with run length encoding, its size for a single value increases by this number. Tuples are inserted as long as they would fit into the block B1, B2, B3, B4 where the smallest of both values, Non_RLE_size and RLE_size, is chosen for each column Col1, Col2, Col3 respectively. In FIG. 6, column Col1 and Col2 are run length encoded. Column Col3 would need more memory for storing the length prefix than for storing the values separately. Thus, it will not be compressed by run length encoding.

The last entry in the header table is used as a runtime optimization. There, all last frequent value nodes that appear in all insertion paths are chained together in a doubly linked list. The entries of latter are ordered by their IDs 13 like those in the lists for regular columns. This list can be used to store the IDs 13 for each tuple in an additional auxiliary column rank. After all input blocks B1, B2, B3, B4 have been transformed into presorted blocks with this rank column, they can easily be sorted without the costly lookup during the insertion in the tuple rank and compression lattice (TRCL). The blocks B1, B2, B3, B4 can be merged together as in merge sort and only the auxiliary column rank needs to be compared. Of course, this can only be done if the additional memory can be provided, because the size of each tuple would increase by a constant value. This would lead to a linear blow up in the number of tuples in the worst case where no precompression could be performed using run length encoding which would compensate the negative effect. In the running example, it is assumed that the auxiliary rank column requires 1 byte to store a node ID.

Figure 7:
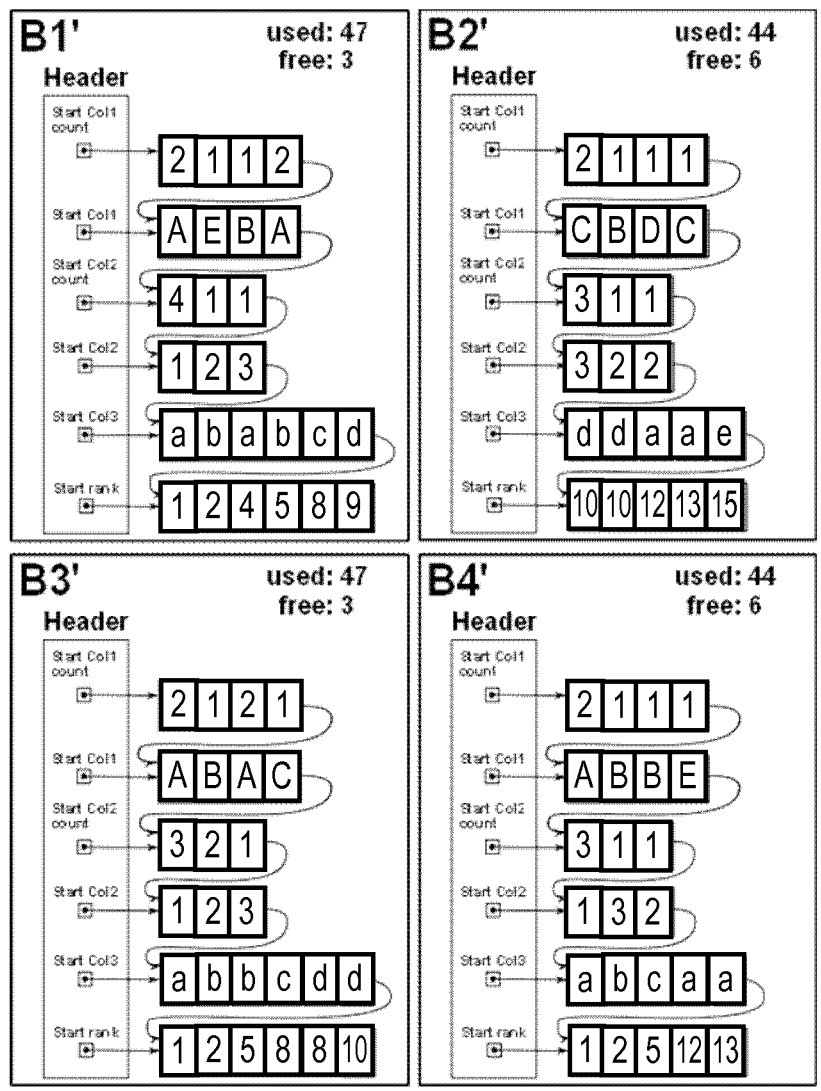
FIG. 7 is a schematic block diagram of the memory blocks of FIG. 3 after sorting and precompression in single blocks.

Table 4 shows the input table after all tuples have been sorted and precompressed in single blocks which are shown in FIG. 7.

TABLE 4

| Col 1 | Col 2 | Col 3 | rank |
|-------|-------|-------|------|
| A | 1 | a | 1 |
| A | 1 | b | 2 |
| E | 1 | a | 4 |
| B | 1 | b | 5 |
| A | 2 | c | 8 |
| A | 3 | d | 9 |
| C | 3 | d | 10 |

TABLE 4-continued

| Col 1 | Col 2 | Col 3 | rank |
|---|---|---|---|
| C | 3 | d | 10 |
| B | 3 | a | 12 |
| D | 2 | a | 13 |
| C | 2 | e | 15 |
| A | 1 | a | 1 |
| A | 1 | b | 2 |
| B | 1 | b | 5 |
| A | 2 | c | 8 |
| A | 2 | d | 8 |
| C | 3 | d | 10 |
| A | 1 | a | 1 |
| A | 1 | b | 2 |
| B | 1 | c | 5 |
| B | 3 | a | 12 |
| E | 2 | a | 13 |

The runtime optimization was used in the example and the auxiliary column rank has been added. Note that the run length encoding compression was about sufficient to compensate the additionally required memory. Now, 18 of 200 bytes are unused, compared to 24 of 200 bytes in FIG. 3 and no additional blocks need to be allocated.

Figure 8:
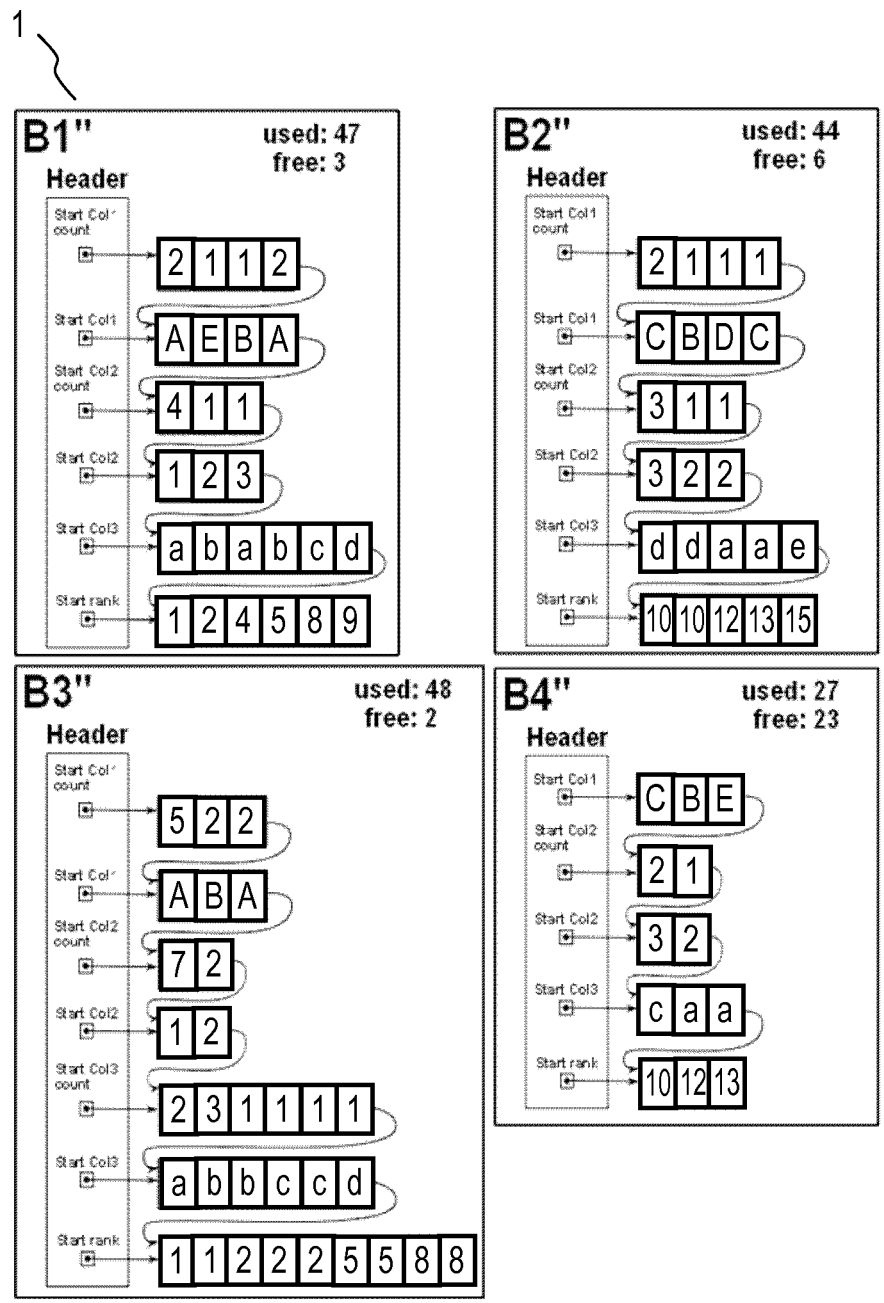
FIG. 8 is a schematic block diagram of the memory blocks of FIG. 7 after merging Blocks B1' with B2' and B3' with B4'.

Table 5 shows the input table after merging Blocks B1' with B2' and B3' with B4'. The resulting blocks B1", B2", B3", B4" are shown in FIG. 8.

TABLE 5

| Col 1 | Col 2 | Col 3 | rank |
|---|---|---|---|
| A | 1 | a | 1 |
| A | 1 | b | 2 |
| E | 1 | a | 4 |
| B | 1 | b | 5 |
| A | 2 | c | 8 |
| A | 3 | d | 9 |
| C | 3 | d | 10 |
| C | 3 | d | 10 |
| B | 3 | a | 12 |
| D | 2 | a | 13 |
| C | 2 | e | 15 |
| A | 1 | a | 1 |
| A | 1 | a | 1 |
| A | 1 | b | 2 |
| A | 1 | b | 2 |
| B | 1 | b | 5 |
| B | 1 | c | 5 |
| A | 2 | c | 8 |
| A | 2 | d | 8 |
| C | 3 | d | 10 |
| B | 3 | a | 12 |
| E | 2 | a | 13 |

After a first recursive call of merge sort where block lists—containing only one sorted block each—(B1')+(B2') have been merged to sorted block list (B1", B2") and (B3')+(B4') to (B3", B4"). By comparing FIGS. 7 and 8 it can be seen, that Block B1'=B1", B2'=B2" because tuples in this example have already been accidentally sorted before. The next recursive call would merge the sorted lists (B1", B2")+(B3", B4") resulting in the final sorted block list (B1''', B2''', B3''') shown in FIG. 10. In alternative embodiments of the present invention any other sort algorithm known to a person skilled in the art could be used.

If memory for the runtime optimization cannot be provided, each tuple must be looked up and inserted in the tuple rank and compression lattice (TRCL) when it is scanned in each block merge step. Despite the fact that this is slower, it compresses the tuples continuously because after each merge step, the benefit through RLE grows since more and more frequent column values are grouped together.

The insertion of a tuple into the tuple rank and compression lattice (TRCL) can be done in $$O\left(c^2 * \log\left(\frac{n}{c}\right)\right) + O(c)$$

where c is the number of columns and n is the number of nodes in the lattice. Both are constant and c will usually be much smaller than n. The tuple can be interpreted as a set of linked column nodes which must be found as a path in the lattice's embedded frequent pattern tree or created if necessary. Second, the column list links must be set appropriately to maintain the tuple order for transformation of the lattice in blocks. Therefore, newly created nodes must be inserted in the doubly linked lists.

The insertion of the first tuple is trivial. The longest matching frequent pattern path must be found and all non frequent nodes will be created as temporary nodes. Second, the links in the header table are set to all nodes on the complete insertion path.

Figure 9:
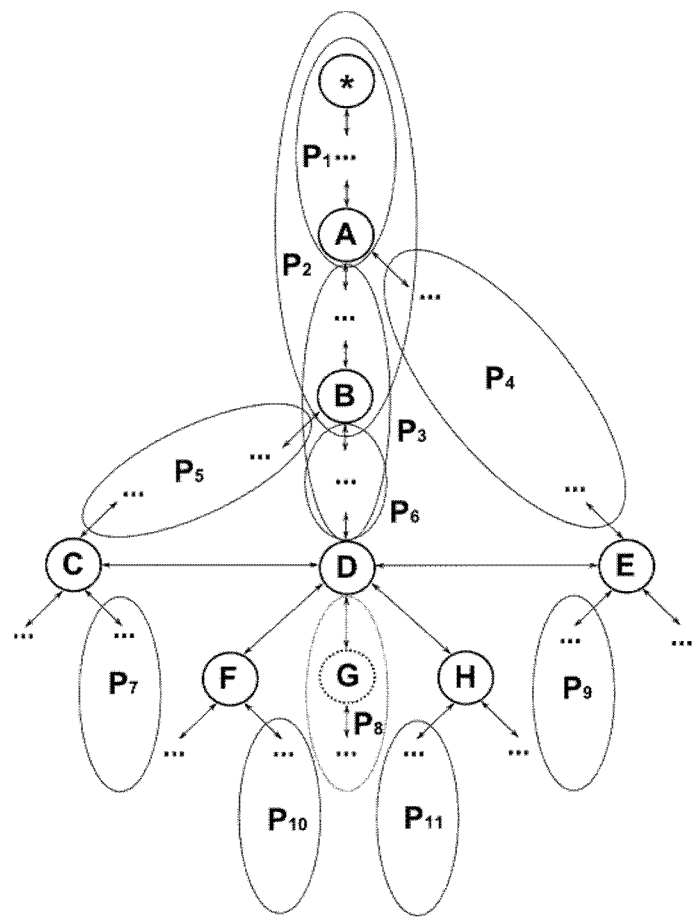
FIG. 9 is a schematic diagram of insertion paths in a tuple rank and compression lattice, in accordance with an embodiment of the present invention.

FIG. 9 shows all possible paths that must be handled when a tuple is inserted in the non-trivial case when at least one tuple has already been inserted into the tuple rank and compression lattice (TRCL). In this case, the new tuple has a preceding or succeeding tuple, or in most cases both of them. A prefix path for the tuple may already exist in the tree ($P_1 \cup P_2 \cup P_3 \cup P_6 \cup \{D\}$). These nodes have already been processed correctly when the first tuple that shares this path with the new one was inserted. This path consists at least of the root node if no column values can be shared. If node D is the last node on this path, all nodes in P8 are not in the tree for infrequent nodes yet or are static frequent nodes but still the corresponding counter RLE_count has a value of zero. In both cases, they must be linked in the right position in the column lists. Therefore, the path of either the preceding or succeeding tuple must be traversed to link the new nodes in between. For both, the predecessor p and the successor s, there are two cases. In case 1 p and s share the entire, already processed prefix path with the new tuple t, wherein path from the root to D is included. In case 2 the prefix path of t and p or s consists of a shared part, P2 for p and P1 for s, and a non shared part, P5 for p and P4 for s. C and E are the column predecessor and successor of D.

In case 1, the sets of column nodes which still have to be linked to the new nodes in P8 consist of $\{F\} \cup P_{10}$ for p and $\{H\} \cup P_{11}$ for s. One of these paths has to be traversed to link all remaining nodes of P8 in between and can be accessed through the hash tables in current node D.

In case 2, the neighbor path starting at C or E must be traversed. Since this path may belong to another subtree, the order in which columns appear from the root to leaf nodes may be different than the order in the insertion path. Therefore, the preceding column nodes have to be collected from $P_5 \cup P_7$ and the succeeding column nodes from $P_4 \cup P_9$. The scans of P4 and P5 can be stopped as soon as an already processed column node on the shared prefix path (A or B) is reached. For the rank column list, the last FP node on the insertion path must be processed analogously.

Figure 10:
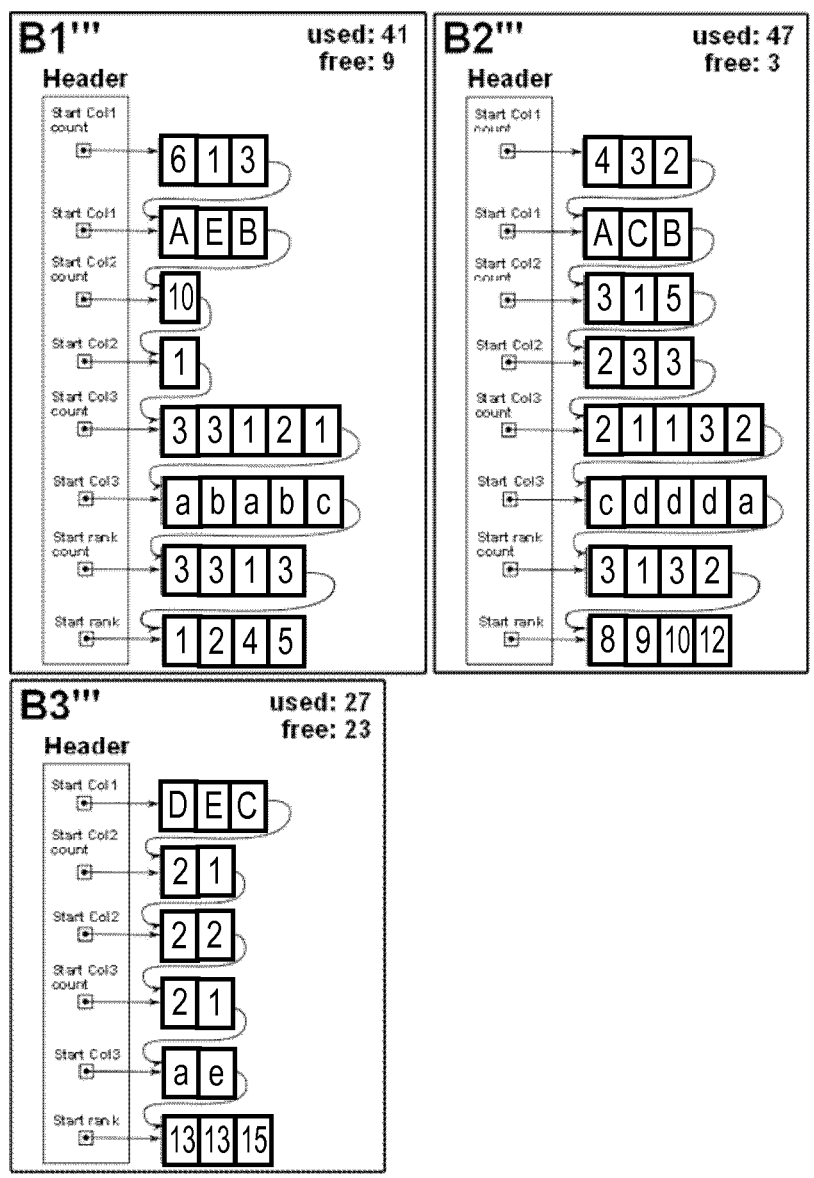
FIG. 10 is a schematic block diagram of the memory blocks of FIG. 8 after complete sorting and precompression.

After the single blocks have been merged together to sort the entire table, the sorting and precompression phase for this input data is finished. Table 6 shows the sorted result table of the running example, and FIG. 10 shows the result blocks B1''', B2''', B3''', B4'''. The auxiliary column rank is still stored in each block and is kept until the final phase completes.

TABLE 6

| Col 1 | Col 2 | Col 3 | rank |
|-------|-------|-------|------|
| A | 1 | a | 1 |
| A | 1 | a | 1 |
| A | 1 | a | 1 |
| A | 1 | b | 2 |
| A | 1 | b | 2 |
| A | 1 | b | 2 |
| E | 1 | a | 4 |
| B | 1 | b | 5 |
| B | 1 | b | 5 |
| B | 1 | c | 5 |
| A | 2 | c | 8 |
| A | 2 | c | 8 |
| A | 2 | d | 8 |
| A | 3 | d | 9 |
| C | 3 | d | 10 |
| C | 3 | d | 10 |
| C | 3 | d | 10 |
| B | 3 | a | 12 |
| B | 3 | a | 12 |
| D | 2 | a | 13 |
| E | 2 | a | 13 |
| C | 2 | e | 15 |

After the precompression, it must be decided if the compression rate is sufficient or whether there is still a lot of redundancy among column values of the sorted tuples. For this reason the counter value *_count of the nodes 10 in the global tuple rank and compression lattice (TRCL) tree can be evaluated as a stop criterion. The tree can be traversed and if the counter value *_count of a node N is above a threshold, further optimization iterations can be performed recursively. Therefore the same algorithm is invoked on the tuples identified by N as new root node. This invocation works on a smaller fractional amount of the original input data because all columns of the nodes on the path from the root to N don't need to be considered anymore and the original table is also filtered by the ID of node N. Therefore, the support threshold used in the mining phase of the recursive invocation needs to be adjusted. To guarantee that the recursive calls can work with the limited available buffer memory, the parent tuple rank and compression lattice (TRCL) might be serialized and written to disk until it is completely processed. It is not needed for the recursive call and the buffer can be reused to construct the new tuple rank and compression lattice (TRCL).

Figure 11:
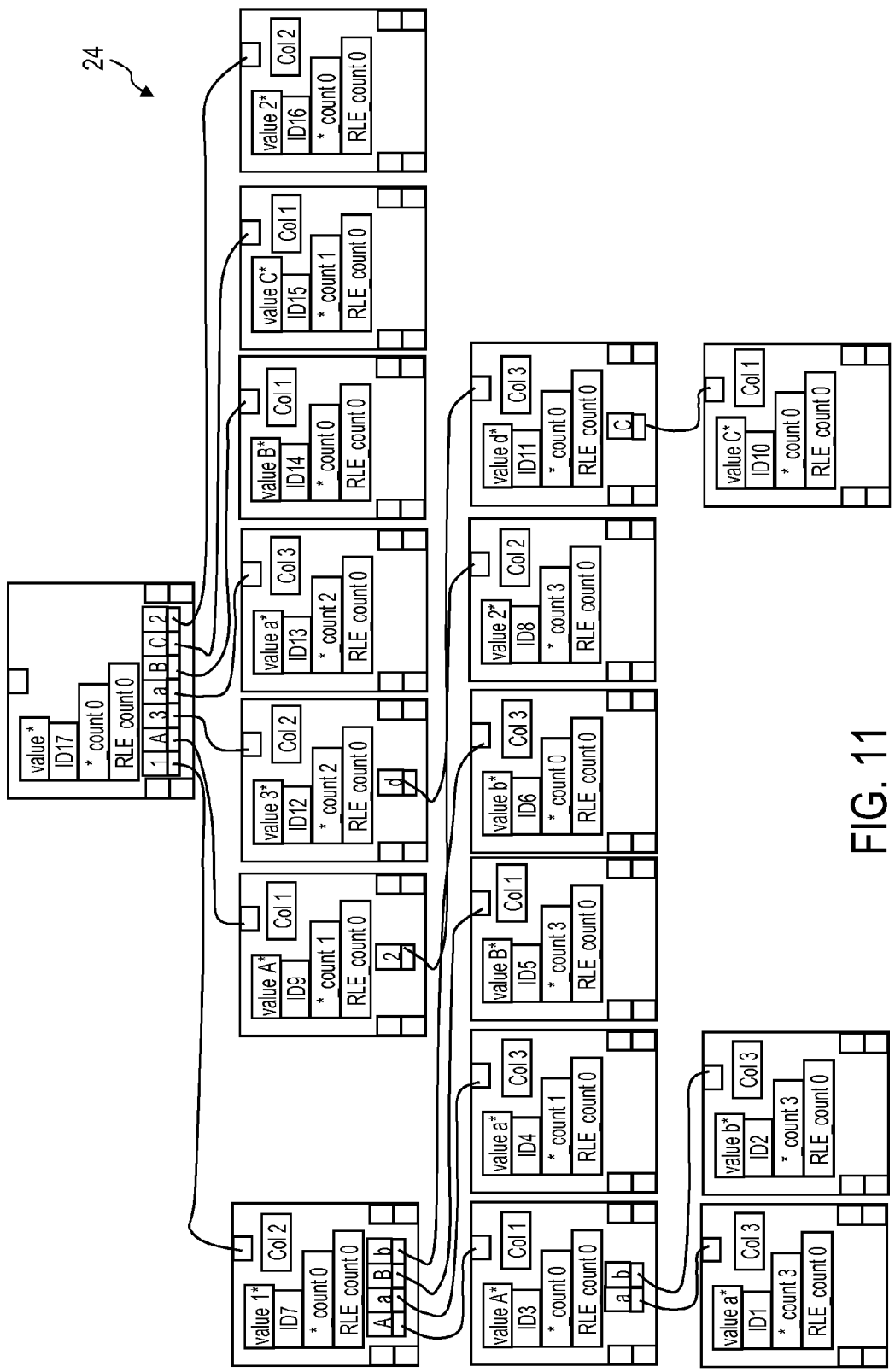
FIG. 11 is a schematic block diagram of the exemplary final tuple rank and compression lattice after the presorting and compression phase.

FIG. 11 shows the final embedded tuple rank and compression lattice (TRCL) tree 24 for the running example data set. Since the example is very small, it would not be beneficial to perform other iteration on any of the frequent column pattern nodes. But one might imagine that the example itself was only the last recursive optimization call of a bigger table with a lot more columns and more tuples. In this case, the algorithm of the previous recursion level can continue with the next node or return to the final compression phase if none exists anymore.

Figure 12:
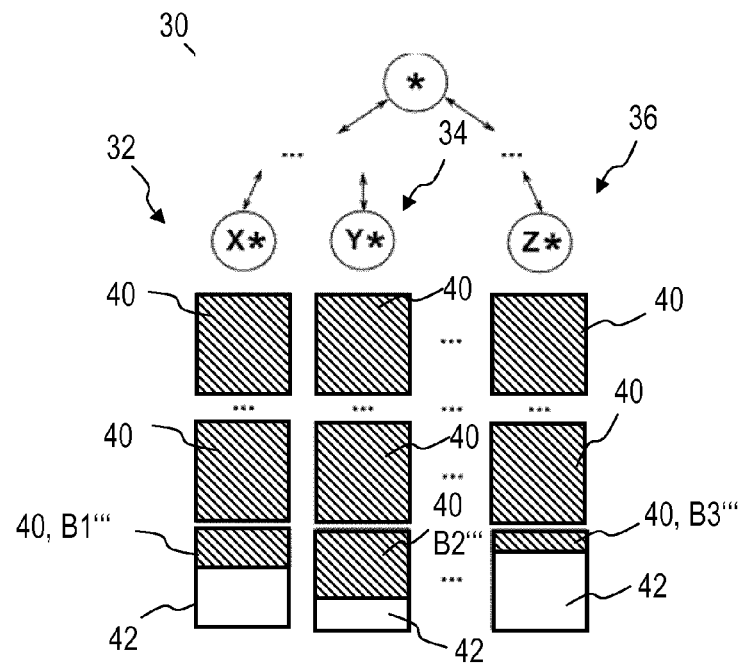
FIG. 12 is a schematic block diagram of memory gaps after recursive precompression calls.

After a recursive precompression finishes, the auxiliary rank column is still stored in the blocks 40. It can be removed after the initial call completes since it is not needed anymore. Beside that, each recursive method invocation leaves a gap 42 at the end of the last block 40 because of the sort phase which must not interfere with other tuple patterns in neighbor subtrees. FIG. 12 illustrates this issue. In FIG. 12 a tree 30 with three subtrees 32, 34, 36 is shown, each comprises a number of memory blocks 40, wherein in each subtree 30, 32, 34 at the end of the last block 40 a gap 42 of different size is shown.

The gaps 42 could be removed after each recursive call returns to keep memory consumption low or at the end of the initial invocation when the rank column is removed. For this purpose, the blocks 40 are scanned a last time with inserting all tuples in the tuple rank and compression lattice (TRCL) like in the precompression phase to be able to determine if a column should be run length encoded or not and when a cell block would be filled.

Figure 13:
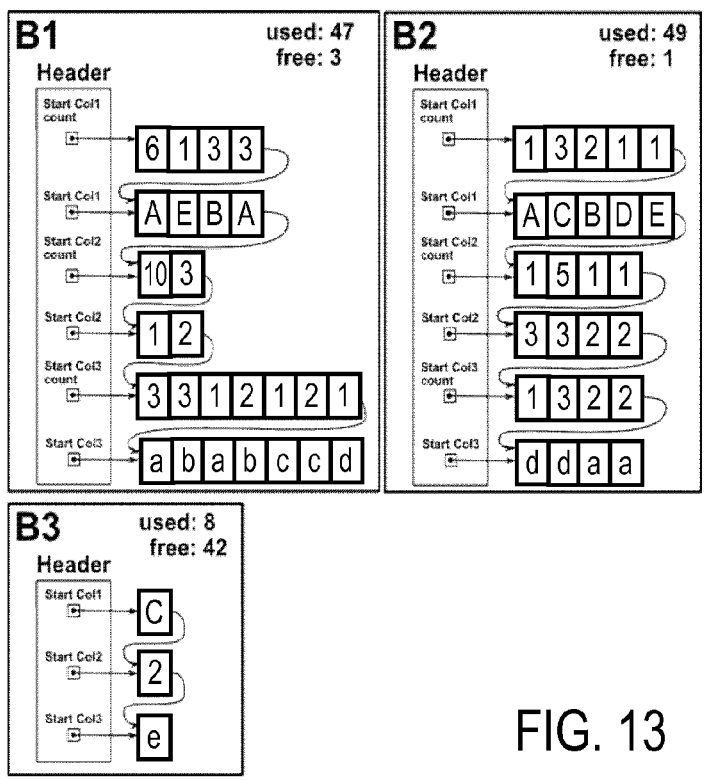
FIG. 13 is a schematic block diagram of the memory blocks of FIG. 10 after final compression.

Table 7 shows the resulting table for the running example after the final compression finished. The respective blocks are shown in FIG. 13. Note, that a new tuple value is physically stored for each node on the pattern path. Neighbor patterns that share the same column value are possible and could be removed. But this optimization only carries weight if the counter values RLE_count are low since only one value code could be saved.

TABLE 7

| Col 1 | Col 2 | Col 3 |
|-------|-------|-------|
| A | 1 | a |
|   |   | b |
| E |   | a |
| B |   | b |
|   |   | c |
| A | 2 | 2 |
|   |   | d |
| A | 3 | d |
| C | 3 | d |
| B |   | a |
| D | 2 | a |
| E |   |   |
| C | 2 | e |

Denormalizing tables blows up the amount of memory required to store all tuples because column values will be duplicated for each join partner. This redundancy can be mostly avoided with the proposed approach since the column value patterns will get higher counters. When two N–1 joined tables A, B shall be denormalized, the method has to start at the parent table to determine the exact count for all key values in the foreign key columns. These counts must be used as multiplier in the child table for all column value combinations having the respective primary key values. This leads to the right counters in the melted table. Afterwards, the mining step is invoked on all columns in the schema of A∪B and both tables are merged to the melded table which is compressed as in the single table case. For M-N joins, both column counters have to be multiplied by the cardinality of the other table.

Beside the improvement in memory consumption, the efficiency of the table scan can be dramatically improved due to the fact that a scan is directly possible on the compressed data. A predicate that is applied on one encoded column value evaluates to true or false for all original values compressed by the counter. This increases the scan throughput by orders of magnitude. The only disadvantage is that no random tuple access can be done anymore. Therefore, columns that should be run length encoded should be chosen carefully in advance based on access statistics.

Since the proposed algorithm is designed with independent recursive calls, the latter may be executed in parallel by several threads. The available main memory has to be partitioned to keep memory constraints. Each root node in the tuple rank and compression lattice (TRCL) can be processed by one thread and be merged together single threaded afterwards.

When tuples are sorted, blocks containing tuples that belong to more than one root node must be locked to avoid interference. If enough main memory is available, this problem can be avoided if only tuples are written into one block that share the same pattern and therefore have the same rank.

The pattern enumeration phase uses the frequent pattern tree construction algorithm to arrange the column patterns in a way that frequent sub-patterns will be shared with a high probability. But the number of nodes in the found pattern tree can still be suboptimal for the compression rate.

Therefore the patterns may be correlated, i.e. after the most frequent column value V has been chosen to be the node with the highest/lowest rank, it partitions the other patterns and therefore the tuples into two parts. A first part with patterns containing V as sub pattern which will be inserted in the tree with V as root node, and a second part with patterns which do not contain V and will therefore have other root nodes in the same level like V. To find an optimal solution, these two partitions must be scanned again to have updated counts for less frequent values.

Also only frequency counts may be used as criterion to do the pattern enumeration because it is expected that a tree with a low number of nodes will be created. But other criteria may lead to a better compression rate, e.g. the number of bytes/bits needed to store a column value in a block. It may be beneficial to have nodes with less frequent but big column values in a lower tree level next to the root to be shared by several patterns.

To cover these cases, an algorithm could be used which optimizes the resulting frequent pattern tree. Column nodes could be weighted and swapped within the tree to modify paths. But the tree properties mentioned in phase two must be preserved. If for instance the left containment property is violated, high ranked tuple patterns in subtrees with a lower rank as root node will not be found during the lookup.

In addition to that, multiple columns may be grouped together to be interpreted as a single item in the data mining phase. The latter may be beneficial when columns are strongly correlated. Since an item will be the combination of all values, there will probably be more items with lower RLE counts. But the dimensionality of the problem would be reduced.

Other pattern enumerations are also possible with perhaps less efficient compression ratios but more effective scanning behaviour.

The current stop criterion for recursive method invocations is the counter value *_count in frequent column nodes. But it would be better to know the cardinality for each column that did not appear on the frequent prefix path to estimate if a further compression would be beneficial. Therefore, an efficient incremental cardinality estimation algorithm would be helpful which updates the current estimation after new nodes have been created for the inserted tuple in the following subtree.

The inventive method for encoding data stored in a column-oriented manner can be implemented as an entire software embodiment, or an embodiment containing both hardware and software elements. In a preferred embodiment, the present invention is implemented in software, which includes but is not limited to firmware, resident software, microcode, etc.

Furthermore, the present invention can take the form of a computer program product accessible from a computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk, and an optical disk. Current examples of optical disks include compact disk-read only memory (CD-ROM), compact disk-read/write (CD-R/W), and DVD. A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution. Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modems, and Ethernet cards are just a few of the currently available types of network adapters.

What is claimed is:

1. A method for encoding data stored in a column-oriented manner, comprising:

finding column patterns among a set of data tuples, wherein each data tuple contains a set of columns, and wherein the column patterns are identified based upon a single column individually, and upon a combination of columns together, by grouping each column together with one or more other columns, without regard for column order, and evaluating rows of the grouped columns to determine the column patterns;

identifying single column values occurring in the column patterns, in order to reduce a number of nodes of a prefix tree comprising a plurality of nodes;

ordering the single column values occurring in the column patterns based on their corresponding frequencies into the prefix tree, wherein the prefix tree defines a pattern order and is constructed to share the nodes corresponding to the single column values occurring more frequently;

sorting the data tuples according to the pattern order, resulting in sorted data tuples; and encoding columns of the sorted data tuples using run-length encoding.

2. The method according to claim 1, further comprising:
dividing the sorted data tuples into smaller already precompressed parts; and
recursively using the smaller already precompressed parts to find the column patterns among the sorted data tuples.

3. The method according to claim 1, further comprising using only values of different columns in each data tuple.

4. The method according to claim 1, further comprising using a limited number of columns of a single table as the set of columns.

5. The method according to claim 4, further comprising interpreting the single table as a transactional database with the data tuples as transactions and pairs of column ID and column value as items.

6. The method according to claim 5, further comprising:
generating an output list containing at least one of all column value combinations and all closed column value combinations under a minimum support threshold, which is dynamically adaptable to reduce a size of the output list; and bounding a maximum length of each column value combination by the number of columns used in each data tuple.

7. The method according to claim 4, further comprising using only columns of the single table having certain characteristics promising a high compression ratio for building the data tuples.

8. The method according to claim 7, further comprising:
estimating cardinality for columns of the single table using an incremental cardinality algorithm; and
using the cardinality as a characteristic promising a high compression ratio.

9. The method according to claim 1, further comprising:
assigning a pair of column ID and column value to each node of the prefix tree, each node having an ID field which is unique within the prefix tree and two counter fields; and
linking the nodes together by at least one of pattern links, column links or rank links.

10. The method according to claim 1, further comprising modifying paths of the prefix tree of the column patterns by weighting or swapping the nodes of the prefix tree to optimize the prefix tree.

11. A data processing system for encoding data stored in a column-oriented manner, comprising:
a processor configured to:
find column patterns among a set of data tuples, wherein each data tuple contains a set of columns, and wherein the column patterns are identified based upon a single column individually, and upon a combination of columns together, by grouping each column together with one or more other columns, without regard for column order, and evaluating rows of the grouped columns to determine the column patterns;
identify single column values occurring in the column patterns, in order to reduce a number of nodes of a prefix tree comprising a plurality of nodes;
order the single column values occurring in the column patterns based on their corresponding frequencies into the prefix tree, wherein the prefix tree defines a pattern order and is constructed to share the nodes corresponding to the single column values occurring more frequently;
sort the data tuples according to the pattern order, resulting in sorted data tuples; and
encode columns of the sorted data tuples using run-length encoding.

12. The data processing system according to claim 11, wherein the sorting of the data tuples by the processor includes dividing the sorted data tuples into smaller already precompressed parts, and performing a recursive run for finding the column patterns among the sorted data tuples.

13. A computer program product comprising:
a non-transitory computer readable storage medium having a computer readable program code embodied therewith, the computer readable program code configured to perform operations of:
finding column patterns among a set of data tuples, wherein each data tuple contains a set of columns, and wherein the column patterns are identified based upon a single column individually, and upon a combination of columns together, by grouping each column together with one or more other columns, without regard for column order, and evaluating rows of the grouped columns to determine the column patterns;
identifying single column values occurring in the column patterns, in order to reduce a number of nodes of a prefix tree comprising a plurality of nodes;
ordering the single column values occurring in the column patterns based on their corresponding frequencies into the prefix tree, wherein the prefix tree defines a pattern order and is constructed to share the nodes corresponding to the single column values occurring more frequently;
sorting the data tuples according to the pattern order, resulting in sorted data tuples; and
encoding columns of the sorted data tuples using run-length encoding.

14. The computer program product of claim 13, where the operations further comprise:
dividing the sorted data tuples into smaller already precompressed parts; and
recursively using the smaller already precompressed parts to find the column patterns among the sorted data tuples.

15. The computer program product of claim 13, wherein the operations use only values of different columns in each data tuple.

16. The computer program product of claim 13, wherein the operations use a limited number of columns of a single table as the set of columns.

17. The computer program product of claim 16, the operations further comprising interpreting the single table as a transactional database with the data tuples as transactions and pairs of column ID and column value as items.

18. The computer program product of claim 17, wherein the operations further comprise:
generating an output list containing at least one of all column value combinations and all closed column value combinations under a minimum support threshold, which is dynamically adaptable to reduce a size of the output list; and
bounding a maximum length of each column value combination by the number of columns used in each data tuple.

19. The computer program product of claim 16, the operations further comprising using only columns of the single table having certain characteristics promising a high compression ratio for building the data tuples.

20. The computer program product of claim 19, the operations further comprising:
estimating cardinality for columns of the single table using an incremental cardinality algorithm; and
using the cardinality as a characteristic promising a high compression ratio.

21. The computer program product of claim 13, the operations further comprising:
assigning a pair of column ID and column value to each node of the prefix tree, each node having an ID field which is unique within the prefix tree and two counter fields; and
linking the nodes together by at least one of pattern links, column links or rank links.

22. The computer program product of claim 13, the operations further comprising modifying paths of the prefix tree of the column patterns by weighting or swapping the nodes of the prefix tree to optimize the prefix tree.

23. The data processing system according to claim 11, wherein the processor is further configured to:

assign a pair of column ID and column value to each node of the prefix tree, each node having an ID field which is unique within the prefix tree and two counter fields; and link the nodes together by at least one of pattern links, column links or rank links.

24. The data processing system according to claim 11, further comprising using a limited number of columns of a single table as the set of columns.

\* \* \* \* \*